(12) United States Patent
Deng et al.

(10) Patent No.: US 9,787,302 B2
(45) Date of Patent: Oct. 10, 2017

(54) SOURCE DRIVER CIRCUIT AND CONTROL METHOD THEREOF

(71) Applicant: Silergy Semiconductor Technology (Hangzhou) LTD, Hangzhou, ZheJiang Province (CN)

(72) Inventors: Jian Deng, Hangzhou (CN); Guojia Liu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 14/944,329

(22) Filed: Nov. 18, 2015

(65) Prior Publication Data

US 2016/0172961 A1 Jun. 16, 2016

(30) Foreign Application Priority Data

Dec. 11, 2014 (CN) .......................... 2014 1 0763163

(51) Int. Cl.
*H02M 3/158* (2006.01)
*H03K 17/60* (2006.01)
*H03K 17/687* (2006.01)

(52) U.S. Cl.
CPC .......... *H03K 17/602* (2013.01); *H02M 3/158* (2013.01); *H03K 17/6871* (2013.01)

(58) Field of Classification Search
CPC ........ H02M 3/00; H02M 3/158; H03K 17/00; H03K 17/04126; H03K 17/063; H03K 17/0826; H03K 17/601; H03K 17/602; H03K 17/6871; H03K 2217/00; H03K 2217/0036

USPC ......................................................... 327/109
See application file for complete search history.

(56) References Cited

U.S. PATENT DOCUMENTS

| 8,686,706 B2 | 4/2014 | Cheng |
| 8,779,676 B2 | 7/2014 | Simi |
| 9,054,705 B2 | 6/2015 | Deng et al. |
| 2014/0003096 A1 | 1/2014 | Deng |

OTHER PUBLICATIONS

Self-Powered Source Driving Circuit and Switching Power Supply Thereof, Chinese Patent Application Publication No. CN102969889 to Deng et al., Mar. 13, 2013, certified translation attached.*

* cited by examiner

*Primary Examiner* — Lincoln Donovan
*Assistant Examiner* — David Mattison
(74) *Attorney, Agent, or Firm* — Michael C. Stephens, Jr.

(57) ABSTRACT

A source driver circuit can include: (i) a control transistor having a control terminal and first and second power terminals, where the control transistor is coupled between a power terminal of a main switching transistor and ground; (ii) a power supply capacitor coupled between the control terminal of the main switching transistor and ground, where the power supply capacitor is configured to receive a bias voltage that is substantially constant; (iii) a freewheeling diode having a cathode coupled to a control terminal of the main switching transistor, and an anode coupled to the second power terminal of the main switching transistor; and (iv) the control transistor being controllable to be periodically turned on and off to control the main switching transistor to correspondingly follow on and off states of the control transistor.

14 Claims, 7 Drawing Sheets

SOURCE DRIVER CIRCUIT AND CONTROL METHOD THEREOF

RELATED APPLICATIONS

This application claims the benefit of Chinese Patent Application No. 201410763163.5, filed on Dec. 11, 2014, which is incorporated herein by reference in its entirety.

FIELD OF THE INVENTION

The present disclosure generally relates to the field of switching power supplies, and more particularly to source driver circuitry and associated methods.

BACKGROUND

A switching power supply may typically include a power stage circuit and a control circuit. The control circuit can be used to regulate on and off times of a power switch in a switch-type converter based on variations of an input voltage, various internal parameters, and a load, so as to maintain an output voltage or an output current of the switching power supply as substantially constant. Therefore, control approaches are very important to the design of a switching power supply, and may affect the performance thereof. Different power supply results may be achieved with different detection signals and/or different control circuits.

SUMMARY

In one embodiment, a source driver circuit configured for a power converter including a main switching transistor having a control terminal and first and second power terminals, can include: (i) a control transistor having a control terminal and first and second power terminals, where the control transistor is coupled between the second power terminal of the main switching transistor and ground; (ii) a power supply capacitor coupled between the control terminal of the main switching transistor and ground, where the power supply capacitor is configured to receive a bias voltage that is substantially constant; (iii) a freewheeling diode having a cathode coupled to the control terminal of the main switching transistor, and an anode coupled to the second power terminal of the main switching transistor; (iv) the control transistor being controllable to be periodically turned on and off to control the main switching transistor to correspondingly follow on and off states of the control transistor, where when the main switching transistor is on, a current of a main current path flows from the first power terminal of the main switching transistor to the second power terminal of the main switching transistor, and flows from the first power terminal of the control transistor to the second power terminal of the control transistor; and (v) the main switching transistor having an on time interval comprising a first time interval from an end of an off state to a beginning of a fully on state, and a second time interval when the main switching transistor is fully on, where the control transistor is configured to provide a substantially constant start-up current during the first time interval.

In one embodiment, a method of controlling a source driver circuit configured for a power converter including a main switching transistor having a control terminal and first and second power terminals, can include: (i) coupling the control terminal of the main switching transistor to a bias voltage that is substantially constant; (ii) changing a voltage of the second power terminal of the main switching transistor by controlling a voltage between the control terminal and the second power terminal of the main switching transistor to be higher or lower than a conduction threshold voltage of the main switching transistor to correspondingly turn on or off the main switching transistor; (iii) where when the main switching transistor is on, a current of a main current path flows from the first power terminal of the main switching transistor to the second power terminal of the main switching transistor; (iv) where an on time interval of the main switching transistor comprises a first time interval from an end of an off state to a beginning of a fully on state, and a second time interval when the main switching transistor is fully on; and (v) controlling a current flowing from the control terminal and the second power terminal of the main switching transistor to be a substantially constant start-up current during the first time interval.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

The source driver mode is widely employed in variable power converters due to its relatively low power losses, and high conversion efficiency. In such a mode, a gate voltage of a main switching transistor may be clamped to a fixed value, and the switching state of the main switching transistor can be controlled by changing a source voltage by a source driver circuit. In a source driver circuit, the main power switching transistor can connect in series with a control transistor. For example, a drain of the control transistor and connect to a source of the main switching transistor, and a source of the control transistor connect to ground.

A gate of the control transistor can receive a pulse-width modulation (PWM) control signal, and as such may be periodically turned on and off. When the PWM control signal is high, the control transistor can be on, and the source of the main switching transistor can connect to ground. Also, a gate-source parasitic capacitor can be charged to increase a gate-source voltage. When the gate-source voltage reaches a level of a conduction threshold voltage, the main switching transistor can be turned on. When the PWM control signal is low, the control transistor may be off, and the path between the source of the main switching transistor and ground may be cut off. Further, the source voltage of the main switching transistor can increase, and the gate-source voltage may correspondingly decrease. When the gate-source voltage decreases to a level of the conduction threshold voltage, the main switching transistor may be turned off.

A soft start of the main switching transistor in each switching period can be achieved by the source driver circuit. Also, electromagnetic interference (EMI) may be generated due to a fast turn-on operation of the main switching transistor. During the turn-on time interval, a relatively high rate of voltage change dVd/dt can indicate too much radiated noise as to EMI, and it is desirable to decrease EMI noise in order to meet appropriate standards.

In one example power converter employing a source driver circuit, a regulation resistor can connect in series with the gate of the main switching transistor in order to limit the charging current of the gate-source capacitor prior to the turn-on operation of the main switching transistor. Therefore, the time that the gate-source voltage takes to reach the conduction threshold voltage may be increased, which can decrease the rate of voltage change dVd/dt and associated radiated EMI noise. However, the regulation resistor with a relatively large resistance can increase the time length of the turn-off operation of the main switching transistor, and possibly result in additional power losses.

Figure 1:
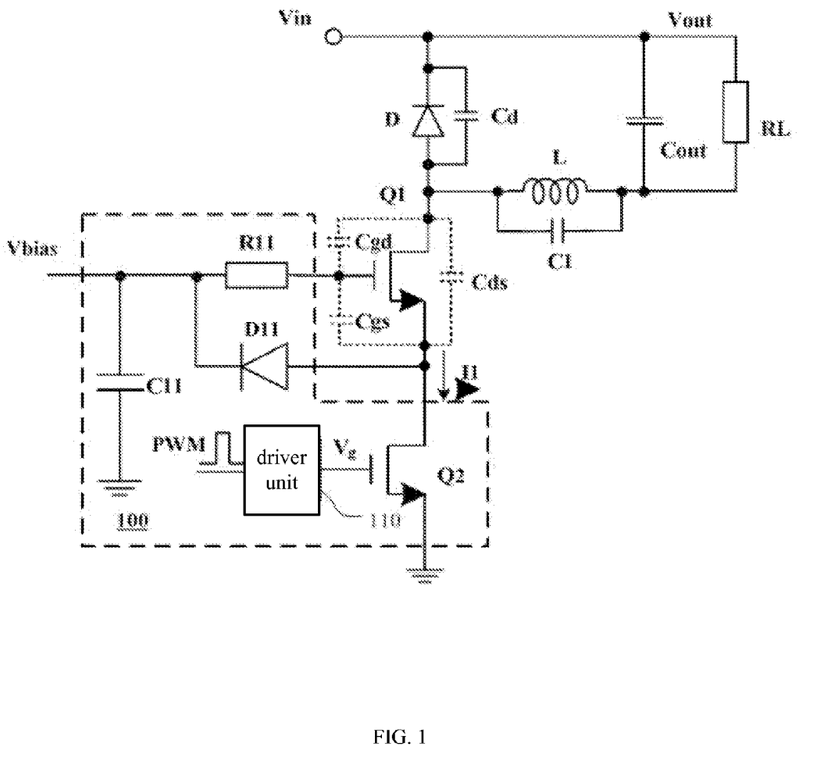
FIG. 1 is a schematic block diagram of an example buck power converter employing a source driver mode.

Referring now to FIG. 1, shown is a schematic block diagram of an example buck power converter employing a source driver mode. The buck power converter can include input terminal Vin that receives a rectified input voltage, and output terminal Vout for supplying power to load RL. Main switching transistor Q1, inductor L, capacitor Cout, and diode D may form a buck power topology circuit. Inductor L and capacitor Cout may be configured as a low pass filter circuit when main switching transistor Q1 is periodically turned on/off. In addition, output capacitor Cout can provide an output voltage at its two terminals.

For example, the buck power converter can also include capacitor Cd connected in parallel with diode D, and capacitor C1 acted in parallel with inductor L, and configured to absorb spike voltages to suppress EMI noise. Main switching transistor Q1 can be implemented by any suitable power switching device (e.g., field-effect transistor, bipolar transistor, etc). When main switching transistor Q1 is implemented as an NMOS transistor, the parasitic capacitor can include gate-source capacitor Cgs, gate-drain capacitor Cgd, and drain-source capacitor Cds.

Source driver circuit 100 can include control transistor Q2 connected in series with main switching transistor Q1. Control transistor Q2 can be the same or a different type as compared to main switching transistor Q1 (e.g., NMOS transistors). In this example, the drain of control transistor Q2 can connect to the source of main switching transistor Q1, and the source of control transistor Q2 can connect to ground. Driver unit 110 can connect to the gate of control transistor Q2. Also, the PWM control signal can be converted to gate driving signal Vg of control transistor Q2 by driver unit 110. Therefore, control transistor Q2 may be operated in a switching mode, and as such can be periodically turned on/off.

Source driver circuit 100 can also include power supply capacitor C11, regulation resistor R11, and freewheeling diode D11. Power supply capacitor C11 can connect between bias voltage Vbias and ground, in order to supply a constant voltage to the gate of main switching transistor Q1. Regulation resistor R1 can connect between bias voltage Vbias and the gate of main switching transistor Q1. The cathode of diode D11 can connect to bias voltage Vbias, and the anode of diode D11 can connect to the source of main switching transistor Q1.

When the PWM control signal transitions from low to high, gate driving signal Vg generated by driver unit 110 may go high to turn on control transistor Q2, and source of main switching transistor Q1 can effectively be connected to ground. A start-up current can be generated between the gate and source of main switching transistor Q1 because the gate of main switching transistor Q1 can connect to bias voltage Vbias with a constant voltage. Regulation resistor R11 may limit the value of the start-up current at the beginning of the turn-on operation of main switching transistor Q1. Gate-source capacitor Cgs of main switching transistor Q1 can be charged by the start-up current to gradually increase the gate-source voltage of main switching transistor Q1 until reaching a level of bias voltage Vbias, which may be higher than the conduction threshold voltage of main switching transistor Q1. Therefore, main switching transistor Q1 can be completely turned on after a delay time has elapsed from the on operation of control transistor Q2. The start-up current can be adjusted by regulating the resistance of regulation resistor R11, in order to adjust the delay time.

When the PWM control signal transitions from high to low, gate driving signal Vg generated by driver unit 110 can go low to turn off control transistor Q2, and to effectively cut off the connection between the source of main switching transistor Q1 and ground. While main switching transistor Q1 is still on, the source voltage can approximately equal the drain voltage. Freewheeling diode D11 may then be turned on, and gate-source capacitor Cgs can be discharged through a discharging circuit that includes diode D11 and regulation resistor R11. This can decrease the gate-source voltage of main switching transistor Q1 until less than the conduction threshold voltage of main switching transistor Q1, and main switching transistor Q1 can then be turned off. Therefore, main switching transistor Q1 may be completely turned off after a delay time has elapsed from the off operation of control transistor Q2. The discharging current can be adjusted by adjusting the resistance of regulation resistor R11, in order to adjust the delay time.

The buck power converter is a "forward" power converter. When main switching transistor Q1 is turned on, the inductor current increases, the input voltage is configured to provide energy to the load, and inductor L is configured to store energy. When main switching transistor Q1 is turned off, the inductor current decreases, and inductor L is configured to provide energy to the load. The switching operation of main switching transistor Q1 may be controlled by operation of control transistor Q2, in order to maintain output voltage Vout and/or output current Iout to be substantially constant.

According to the above buck power converter that utilizes a source driver mode, the charging current for the gate-source capacitor may be limited by the regulation resistor connected in series with the gate of the main switching transistor in order to increase the time that the gate-source voltage reaches the conduction threshold voltage. Therefore, the rate of voltage change dVd/dt may be decreased in order to suppress the radiated noise of EMI. However, a relatively large regulation resistor can increase the turn-off time operation of the main switching transistor, and may increase power losses.

Figure 2:
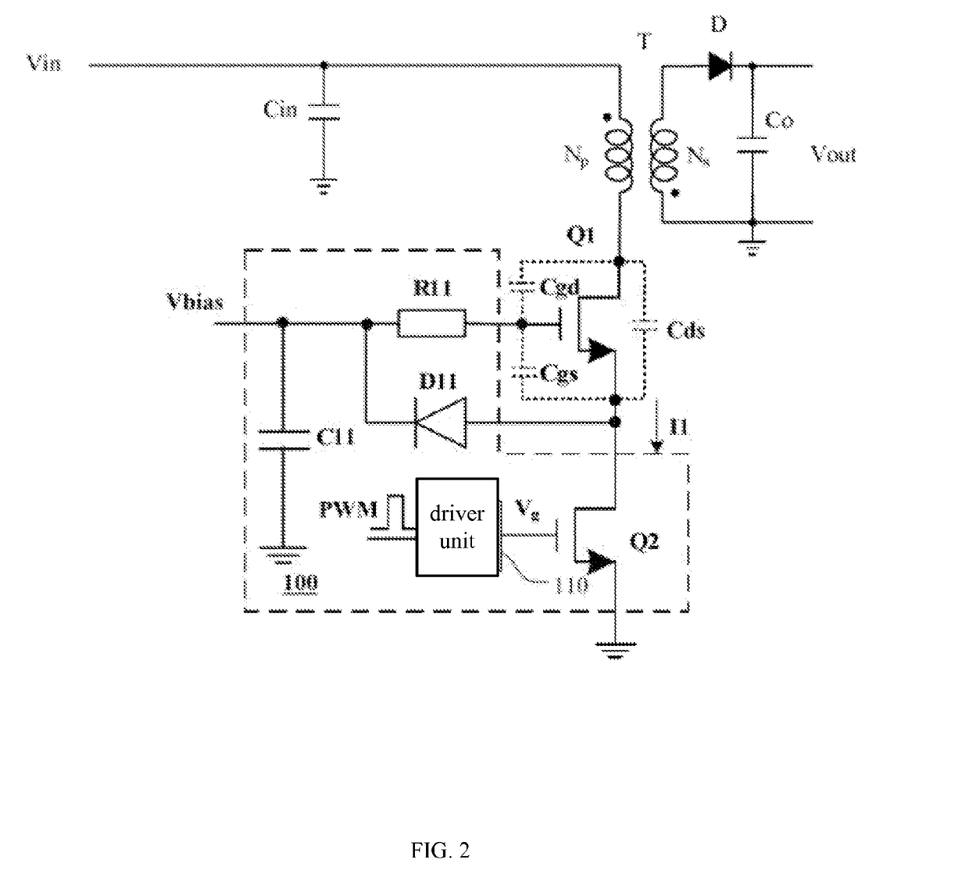
FIG. 2 is a schematic block diagram of an example flyback power converter employing a source driver mode.

Referring now to FIG. 2, shown is a schematic block diagram of an example flyback power converter employing a source driver mode. This example flyback power converter can include input terminal Vin that receives a rectified input voltage, and output terminal Vout that provides energy to a load. The flyback power converter also can include transformer T with primary winding $N_P$ and secondary winding $N_S$ to transfer energy and induce signals. The first terminal of primary winding $N_P$ and the second terminal of secondary winding $N_S$ are dotted terminals in this example, and the second terminal of primary winding $N_P$ and the first terminal of secondary winding are dotted terminals.

At the primary side, an external AC voltage can be rectified and filtered to generate input voltage Vin at the input voltage terminal of the power converter. Input capacitor Cin can connect between input terminal Vin and ground, in order to filter the input voltage. The first terminal of primary winding $N_P$ of transformer T can connect to input terminal Vin. The drain of main switching transistor Q1 can connect to the second terminal of primary winding $N_P$, and the source of main switching transistor Q1 can connect to source driver circuit 100.

At the secondary side, the first terminal of secondary winding $N_S$ of transformer T can connect to the anode of diode D, and the second terminal of secondary winding $N_S$ can connect to ground. Output capacitor Co can connect between the cathode of diode D and ground, and the voltage across output capacitor Co can be configured as output voltage Vout. Main switching transistor Q1, transformer T, output capacitor Cout, and diode D may form the power stage circuit of the flyback power converter. Main switching transistor Q1 can be turned on and off periodically to provide the output voltage across the terminals of output capacitor Co.

When main switching transistor Q1 is on, the inductor current of primary winding $N_P$ can increase to store energy. Because the polarity of secondary winding $N_S$ is different from that of primary winding $N_P$, diode D at the secondary side may be reverse-biased and turned off, and output capacitor Co can provide energy to the load. When main switching transistor Q1 is turned off, a reverse potential can be generated at primary winding $N_P$, and diode D at the secondary side may be forward-biased and turned on to charge output capacitor Co and provide energy to the load. The switching operation of main switching transistor Q1 can be controlled by the operation of control transistor Q2 to maintain output voltage Vout and/or output current Tout to be substantially constant.

According to the above example flyback power converter employing a source driver mode, the charging current for the gate-source capacitor can be limited by the regulation resistor connected in series with the gate of the main switching transistor, in order to increase the time that the gate-source voltage reaches turn-on threshold voltage. Therefore, the rate of voltage change dVd/dt may be decreased in order to suppress the radiated noise of EMI. However, a relatively large regulation resistor can also increase the time of the turn-off operation of the main switching transistor, possibly increasing power losses.

In one embodiment, a source driver circuit configured for a power converter including a main switching transistor having a control terminal and first and second power terminals, can include: (i) a control transistor having a control terminal and first and second power terminals, where the control transistor is coupled between the second power terminal of the main switching transistor and ground; (ii) a power supply capacitor coupled between the control terminal of the main switching transistor and ground, where the power supply capacitor is configured to receive a bias voltage that is substantially constant; (iii) a freewheeling diode having a cathode coupled to the control terminal of the main switching transistor, and an anode coupled to the second power terminal of the main switching transistor; (iv) the control transistor being controllable to be periodically turned on and off to control the main switching transistor to correspondingly follow on and off states of the control transistor, where when the main switching transistor is on, a current of a main current path flows from the first power terminal of the main switching transistor to the second power terminal of the main switching transistor, and flows from the first power terminal of the control transistor to the second power terminal of the control transistor; and (v) the main switching transistor having an on time interval comprising a first time interval from an end of an off state to a beginning of a fully on state, and a second time interval when the main switching transistor is fully on, where the control transistor is configured to provide a substantially constant start-up current during the first time interval.

Figure 3:
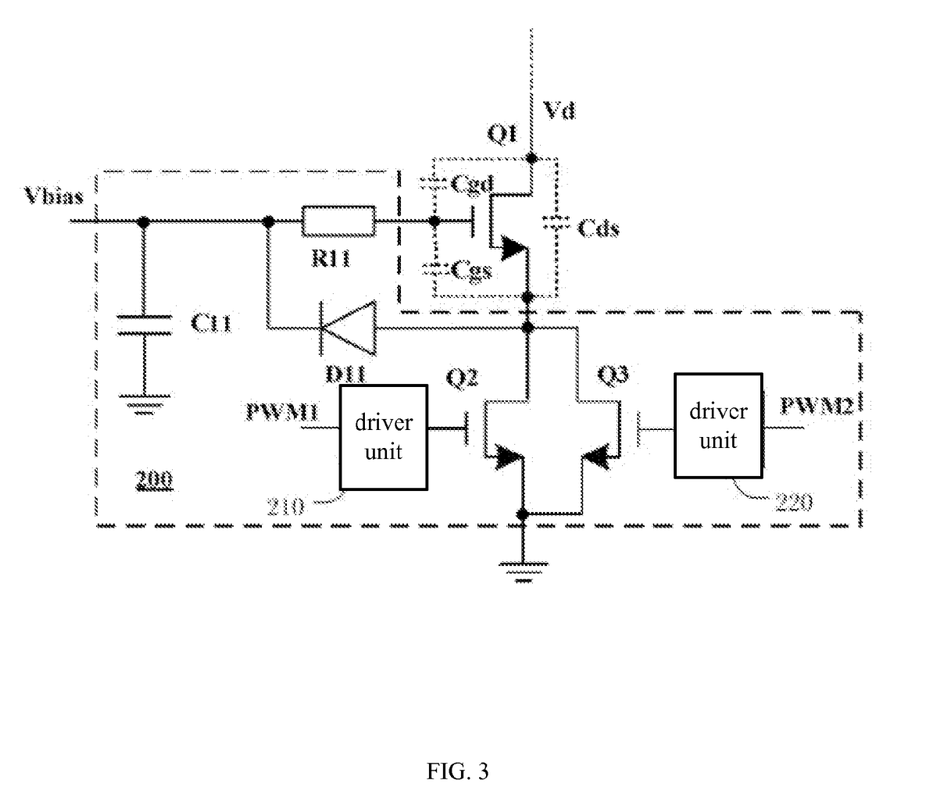
FIG. 3 is a schematic block diagram of a first example source driver circuit of a power converter, in accordance with embodiments of the present invention.
Figure 4:
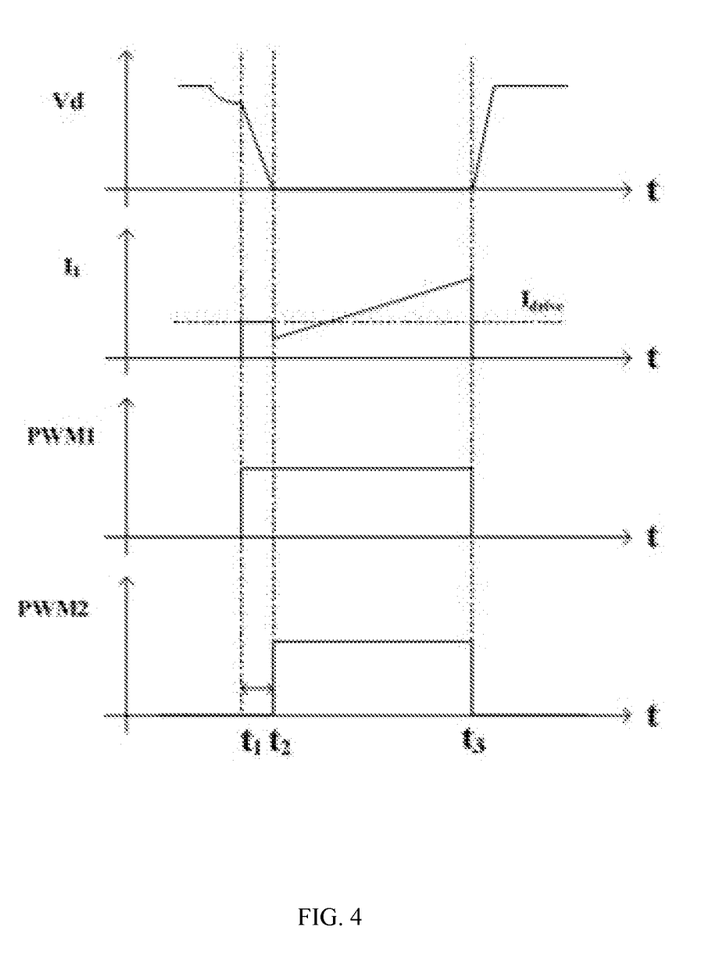
FIG. 4 is a waveform diagram of example operation of the power converter of FIG. 3.

Referring now to FIG. 3, shown is a schematic block diagram of a first example source driver circuit of a power converter, in accordance with embodiments of the present invention. FIG. 4 shows a waveform diagram of example operation of the power converter of FIG. 3. Source driver circuit 200 can include control transistor Q2 that can connect in series with main switching transistor Q1, and control transistor Q3 that can connect in parallel with control transistor Q2. Control transistors Q2 and Q3 can be transistors with the same or different types of main switching transistor Q1 (e.g., NMOS transistors). In this particular example, the drains of control transistors Q2 and Q3 in connect to the source of main switching transistor Q1, and the sources of control transistors Q2 and Q3 can connect to ground.

Driver unit 210 can connect to the gate of control transistor Q2. PWM control signal PWM1 can be converted to gate driving signal Vg1 of control transistor Q2 by driver unit 10 to control transistor Q2 to operate in a constant current mode during a first time interval, and in a switching mode during a second time interval that switches between on/off states. Driver unit 220 can connect to gate of control transistor Q3. PWM control signal PWM2 can be converted to gate driving signal Vg2 of control transistor Q3 by driver unit 20 to control transistor Q2 to operate in a switching mode that switches between on/off states.

Source driver circuit 200 can also include power supply capacitor C11, regulation resistor R11, and freewheeling diode D11. Power supply capacitor C11 can connect between bias voltage Vbias and ground, in order to supply a constant voltage to the gate of main switching transistor Q1. Regulation resistor R11 can connect between bias voltage Vbias and the gate of main switching transistor Q1. Also, an anode of diode D11 can connect to bias voltage Vbias, and a cathode of diode D11 can connect to source of main switching transistor $Q^1$.

In this particular example, source driver circuit 200 can include two control transistors Q2 and Q3 connected in parallel, and independently controlled by two different PWM control signals. In addition, the on-resistance RDSon of control transistor Q2 may be greater than that of control transistor Q3, while saturation current Idrive of control transistor Q2 may be less than that of control transistor Q3. As shown in FIG. 4, the switching periods of PWM control signals PWM1 and PWM2 may be the same, while the duty cycle of PWM control signal PWM1 may be greater than that of PWM control signal PWM2. In each switching period, under the control of PWM control signals PWM1 and PWM2, control transistor Q3 may be turned on after control transistor Q2, and both control transistors Q2 and Q3 can be simultaneously turned off.

At time/moment $t_1$, when PWM control signal PWM1 transitions from low to high, gate driving signal Vg1 generated by driver unit 210 can turn on control transistor Q2. Therefore, the source of main switching transistor Q1 can effectively be connected to ground. Because the gate of main switching transistor Q1 is coupled to bias voltage Vbias with a constant voltage, a start-up current may be generated between the gate and source of main switching transistor Q1. The maximum of the start-up current in the initial turn-on time interval can be limited by saturation current Idrive of control transistor Q2.

Gate-source capacitor Vgs of main switching transistor Q1 can be charged by the start-up current in order to increase the gate-source voltage of main switching transistor Q1. Main switching transistor Q1 may be gradually turned on, and drain voltage Vd can decrease. When the charging operation of gate-source capacitor Cgs of main switching transistor Q1 is completed, the gate-source voltage of main switching transistor Q1 may be substantially equal to bias voltage Vbias, which can be higher than the conduction threshold voltage. Therefore, main switching transistor Q1 can be fully turned on after a delay time from the on operation of control transistor Q2 has elapsed. Addition, the start-up current can be adjusted by changing control transistor Q2, in order to regulate the delay time.

At time $t_2$, when PWM control signal PWM2 transitions from low to high, gate driving signal Vg2 generated by driver unit 220 can go high to turn on control transistor Q3. From time $t_2$, control transistors Q2 and Q3 can be in an on state. At time $t_3$, PWM control signals PWM1 and PWM2 can transition from high to low, gate driving signal Vg1 can also go low to turn off control transistor Q2, and gate driving signal Vg2 can also go low to turn off control transistor Q3. Therefore, the effective connection between the source of main switching transistor Q1 and ground can be cut off. Simultaneously, because switching transistor Q1 remains on, the source voltage can be substantially equal to the drain voltage, in order to turn on freewheeling diode D11.

Therefore, gate-source capacitor Cgs can be discharged through a discharging path that includes diode D11 and regulation resistor R11, in order to gradually decrease the gate-source voltage until less than the conduction threshold voltage, and then main switching transistor Q1 may be turned off. When the discharging of gate-source capacitor Cgs is completed, the source voltage of main switching transistor Q1 may be clamped to be consistent with (e.g., within a diode drop of) bias voltage Vbias. Therefore, main switching transistor Q1 can be turned off after a delay time has elapsed from the off operation (e.g., turn off) of control transistors Q2 and Q3. Also, the discharging current can be regulated by regulating the resistance of regulation resistor R11, in order to regulate the delay time.

In one switching period Ts, the switching operation of main switching transistor Q1 can follow the switching operation of control transistors Q2 and Q3 to maintain output voltage Vout and/or output current Tout to be substantially constant. During the time interval from $t_1$ to $t_2$ (e.g., the start-up stage of main switching transistor Q1), the decreasing slope of drain voltage Vd can be determined in accordance with the start-up current (e.g., saturation current Idrive of control transistor Q2) and the parasitic capacitor of the circuit. The parasitic capacitor may be determined by the circuit itself, which can be indicated as capacitance coefficient K. From the equation Idrive=k*(dVd/dt), the rate of voltage change dVd/dt can be decreased by decreasing the start-up current, in order to suppress the radiated noise of EMI.

During the time interval from $t_2$ to moment $t_3$, and because control transistor Q2 is connected in parallel with control transistor Q3, the on-resistance of the current path can be decreased. Therefore, the conduction power loss of source driver circuit 200 can be decreased. Further, the saturation current of control transistor Q3 can be relatively large, in order to improve the driving capability of source driver circuit 200. For example, the conduction time/moment $t_2$ of control transistor Q3 can be set in order to guarantee that control transistor Q1 is turned on when main switching transistor is completely turned on.

In accordance with the above power converter example that employs a source driver circuit, two control transistors can connect in parallel between the main switching transistor and ground. Control transistor Q2 can be configured to limit the charging current of the gate-source capacitor of the main switching transistor before the conduction. Therefore, the time taken for the gate-source voltage of the main switching transistor to reach the conduction threshold voltage may be increased, in order to decrease the rate of voltage variation dVd/dt to suppress the radiated noise of EMI. The time of the off operation of the main switching transistor can be decreased by decreasing the resistance of the regulation resistor, which can decrease associated power losses.

Figure 5:
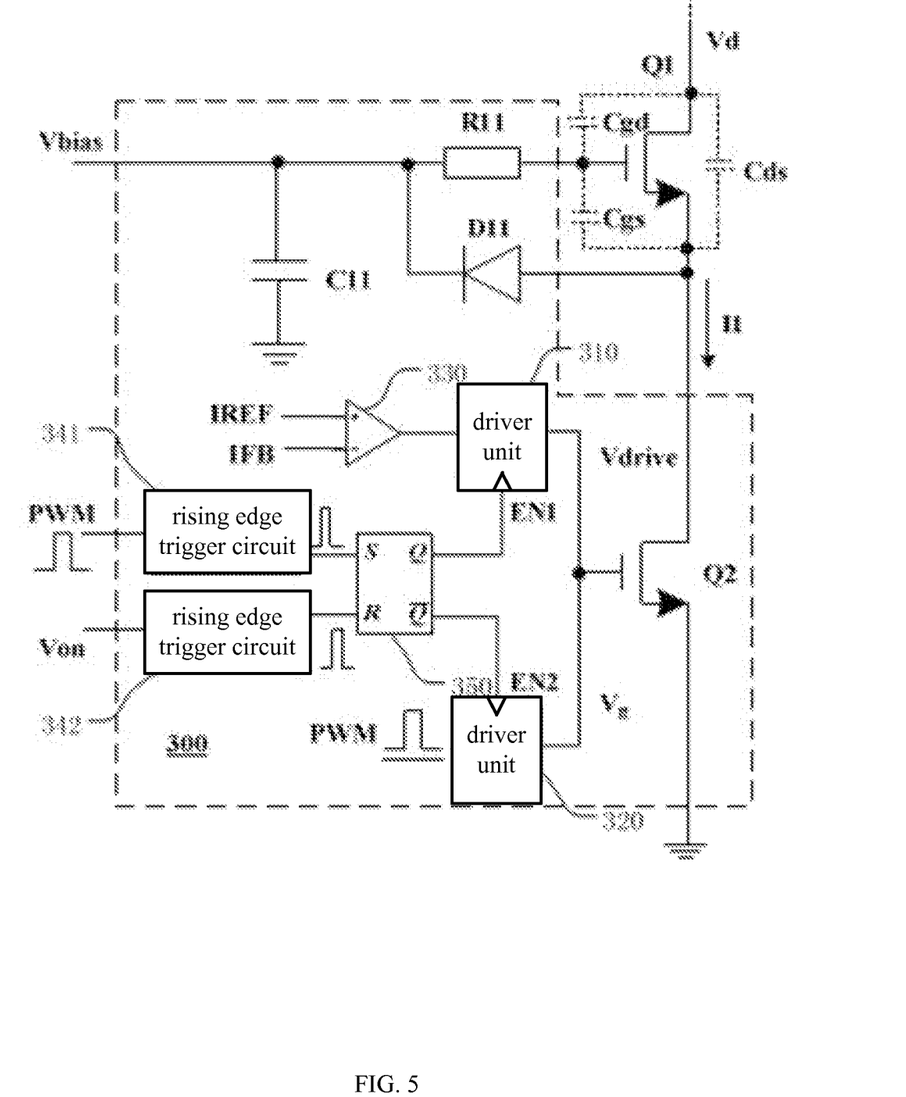
FIG. 5 is a schematic block diagram of a second example source driver circuit of a power converter, in accordance with embodiments of the present invention.
Figure 6:
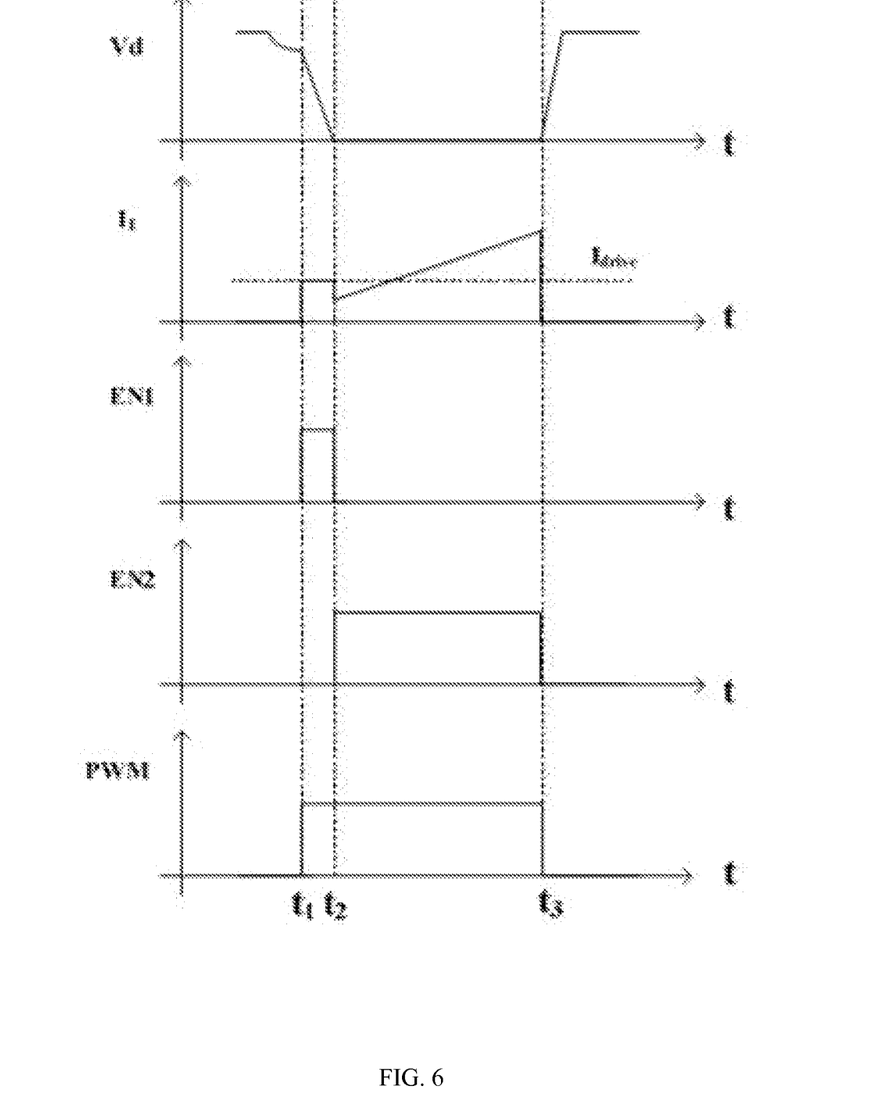
FIG. 6 is a waveform diagram of example operation of the power converter of FIG. 5.

Referring now to FIG. 5, shown is a schematic block diagram of a second example source driver circuit of a power converter, in accordance with embodiments of the present invention. FIG. 6 shows a waveform diagram of example operation of the power converter of FIG. 5. Source driver circuit 300 can include control transistor Q2 that can connect in series with main switching transistor Q1. Control transistor Q2 can be any transistor with the same or a different type as main switching transistor Q1 (e.g., NMOS transistor). In this example, the drain of control transistor Q2 can connect to the source of main switching transistor Q1, and the source of control transistor Q2 can connect to ground. Driver units 310 and 320 can both connect to gate of control transistor Q2. During the start-up time interval of main switching transistor Q1, gate driving signal Vdrive generated by driver unit 310 can control transistor Q2 to operate in a constant current mode. When main switching transistor Q1 is fully turned on, gate driving signal Vg generated by driver unit 320 can control transistor Q1 to operate in a saturation mode.

Source driver circuit 300 can also include power supply capacitor C11, regulation resistor R11, and freewheeling diode D11. Power supply capacitor C11 can connect between bias voltage Vbias and ground, in order to supply a constant voltage to the gate of main switching transistor Q1. Regulation resistor R11 can connect between bias voltage Vbias and the gate of main switching transistor Q1. The cathode of diode D11 can connect to bias voltage Vbias, and the anode of diode D11 can connect to the source of main switching transistor Q1. In this case, the PWM control signal can effectively be divided into two enable signals EN1 and EN2 by source driver circuit 300. In each switching period, when the PWM control signal is high, during a first time interval, driver unit 310 can be enabled, and during a second time interval, driver unit 320 can be enabled, as shown in the example waveforms of FIG. 6.

Source driver circuit 300 can include rising edge trigger circuits 341 and 342, and RS flip-flop 350, in order to achieve a switching operation between a constant current driving mode and a switching operation mode. An input terminal of rising edge trigger circuit 341 can receive the PWM control signal, and an output terminal can connect to set terminal S of RS flip-flop 350. An input terminal of rising edge trigger circuit 342 can receive signal Von that represents the end of the start-up time of main switching transistor Q1, and an output terminal of rising edge trigger circuit 342 can connect to reset terminal R of RS flip-flop 350. Output terminal Q of RS flip-flop 350 can provide enable signal EN1 to the enable terminal of driver unit 310, and enable signal EN2 to the enable terminal of driver unit 320.

A current feedback circuit that includes operational amplifier 330 and driver unit 310 can be utilized to achieve constant current driving for control transistor Q2. Operational amplifier 330 can compare current feedback signal IFB received at a non-inverting input terminal against reference current signal IREF received at an inverting input terminal, in order to generate a current error signal. Gate driving signal Vdrive can be generated in accordance with the current error signal by driver unit 310. Control transistor Q2 can be controlled by gate driving signal Vdrive to operate in a constant current mode. Therefore, current I1 of the main current path may be maintained to be substantially constant.

The switching driving mode of control transistor Q2 can be achieved by driving unit 320 in accordance with the PWM control signal. When enable signal EN2 is high, the PWM control signal can be converted to gate driving signal Vg by driver unit 320, in order to control transistor Q2 to operate in a switching mode. At $t_1$, when the PWM control signal transitions from low to high, a high level signal can be generated by rising edge trigger circuit 341 in accordance with the PWM control signal. Therefore, the signal at set terminal S of RS flip-flop 350 can be high, and the signal at reset terminal R can be low.

Enable signal EN1 at output terminal Q of flip-flop 350 can be high to enable driver unit 310, and enable signal EN2 may be low to disable driver unit 320. Gate driving signal Vdrive can be generated in accordance with the current error signal by driver unit 310. Control transistor Q2 can be controlled by gate driving signal Vdrive to operate in a constant current mode. Therefore, current I1 of the main current path can be maintained to be substantially constant. Because the gate of main switching transistor Q1 can connect via a resistor to a constant bias voltage, a start-up current can be generated between the gate and source of main switching transistor Q1.

The value of the start-up current in the initial start-up time interval may be limited by setting reference current signal IREF because constant Idrive of control transistor Q2 may be determined by reference current signal IREF. Gate-source capacitor Cgs of main switching transistor Q1 can be charged by the start-up current in order to increase the gate-source voltage of main switching transistor Q1. Further, main switching transistor Q1 may be gradually turned on, and drain voltage Vd can be correspondingly decreased.

When the charging for gate-source capacitor Cgs of main switching transistor Q1 is completed, the gate-source voltage of main switching transistor Q1 can approximately be equal to bias voltage Vbias, which can be higher than the conduction threshold voltage of main switching transistor Q1, in order to fully turn on main switching transistor Q1. Therefore, the on operation of main switching transistor Q1 can be later than that of control transistor Q1 by a delay time that can be controlled by changing the start-up current in accordance with reference current signal IREF.

At $t_2$, main switching transistor Q1 may be fully turned on, and rising edge trigger circuit 342 can generate a high level signal in accordance with signal Von that represents the end of start-up of main switching transistor Q1. In this particular example, signal Von can be obtained by detecting drain voltage Vd of main switching transistor Q1. The signal at set terminal S of RS flip-flop 350 can be low, and the signal at reset terminal R can be high. Therefore, enable signal EN1 at output terminal Q of RS flip-flop 350 may be low to disable driver unit 310, and enable signal EN2 may be high to enable driver unit 320. Gate driving signal Vg generated by driver unit 320 can control transistor Q2 to operate in a switching mode, in order to achieve a switching driver.

At $t_3$, when the PWM control signal transitions from high to low, the signal at both the set and reset terminals of RS flip-flop 350 may be low. Enable signal EN1 at output terminal Q of RS flip-flop 350 can be maintained as low to disable driver unit 310, and enable signal EN2 may remain high to enable driver unit 320. Gate driving signal Vg generated by driver unit 320 may be provided to the gate of control transistor Q2. Because the PWM control signal can go low, gate driving signal Vg may be low to turn off control transistor Q2, and to effectively cut off the connection between main switching transistor Q1 and ground.

However main switching transistor Q1 may remain on, so the source voltage can approximately be equal to the drain voltage, in order to turn on diode D11. Gate-source capacitor Cgs can be discharged through the discharging path that includes diode D11 and regulation resistor R11, in order to decrease the gate-source voltage of main switching transistor Q1. When the discharging of gate-source capacitor Cgs of main switching transistor Q1 is completed, the source voltage of main switching transistor Q2 may be clamped to bias voltage Vbias (e.g., plus a diode drop). When the gate-source voltage of main switching transistor Q1 is less than the conduction threshold voltage of main switching transistor Q1, main switching transistor Q1 may be turned off. The off operation of main switching transistor Q1 can be later than that of control transistor Q2 by a delay time that is controlled by the discharging current, which can be regulated by adjusting regulation resistor R11.

In one switching period Ts, the switching operation of main switching transistor Q1 may follow that of control transistor Q2 of source driver circuit 300, in order to maintain output voltage Vout and/or output current Iout to be substantially constant. In the time interval from $t_1$ to $t_2$ (e.g., the initial start-up time interval of main switching transistor Q1), the decreasing slope of drain voltage Vd can be determined by starting current Idrive that corresponds to predetermined reference current signal IREF and the parasitic capacitor of the circuit. The value of the parasitic capacitor may be determined by the circuit, which is indicated as capacitance coefficient K. In accordance with the expression Idrive=k*(dVd/dt), the rate of voltage variation dVd/dt can be decreased by decreasing the start-up current, in order to suppress the radiated noise of EMI.

In accordance with the above example power converter utilising a source driver circuit, a control transistor (e.g., Q2)

can be arranged between the main switching transistor (e.g., Q1) and ground. The control transistor can be controlled to operate in a constant current mode during the initial start-up time interval of the main switching transistor, in order to limit the charging current of the gate-source capacitor (e.g., Cgs). The length of time that gate-source voltage of main switching transistor takes to reach be conduction threshold voltage can be increased, in order to decrease the rate of voltage variation dVd/dt to suppress the radiated noise of EMI. Also, the resistance of the regulation resistor can be decreased as compared to other approaches to reduce the time length of the off operation of the main switching transistor, and to decrease associated power losses.

In one embodiment, a method of controlling a source driver circuit configured for a power converter including a main switching transistor having a control terminal and first and second power terminals, can include: (i) coupling the control terminal of the main switching transistor to a bias voltage that is substantially constant; (ii) changing a voltage of the second power terminal of the main switching transistor by controlling a voltage between the control terminal and the second power terminal of the main switching transistor to be higher or lower than a conduction threshold voltage of the main switching transistor to correspondingly turn on or off the main switching transistor; (iii) where when the main switching transistor is on, a current of a main current path flows from the first power terminal of the main switching transistor to the second power terminal of the main switching transistor; (iv) where an on time interval of the main switching transistor comprises a first time interval from an end of an off state to a beginning of a fully on state, and a second time interval when the main switching transistor is fully on; and (v) controlling a current flowing from the control terminal and the second power terminal of the main switching transistor to be a substantially constant start-up current during the first time interval.

Figure 7:
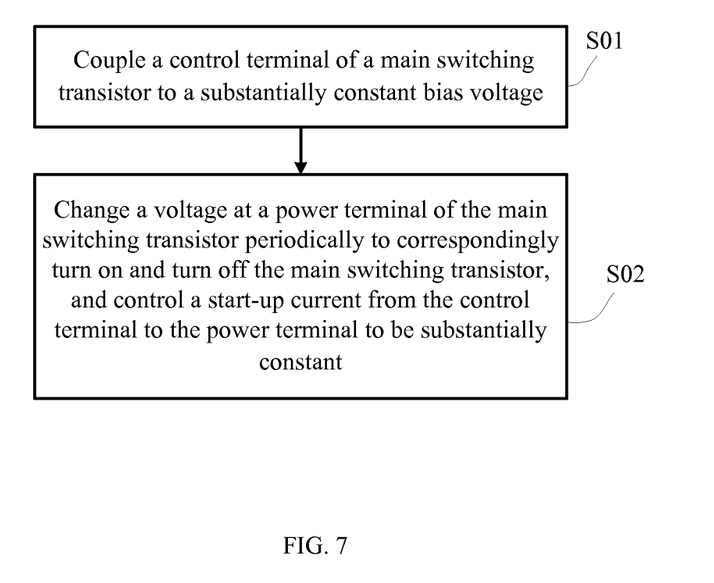
FIG. 7 is a flow diagram of an example method of controlling a source driver, in accordance with embodiments of the present invention.

Referring now to FIG. 7, shown is a flow diagram of an example method of controlling a source driver, in accordance with embodiments of the present invention. The power converter can include a power stage circuit with a main switching transistor having a control terminal (e.g., gate), and first and second power terminals (e.g., source/drain). At S01, the control terminal can be coupled (e.g., via resistor R11) to a constant bias voltage (e.g., Vbias).

At S02, the voltage at a power terminal (e.g., source) of the main switching transistor (e.g., Q1) can be periodically changed. Therefore, the voltage between the gate and source of the main switching transistor can be controlled to be higher or lower than a conduction threshold voltage of the main switching transistor, in order to correspondingly turn on or turn off the main switching transistor. When the main switching transistor is turned on, the current of the main circuit path can flow from the first to the second power terminal (e.g., from drain to source). The on time of the main switching transistor can include a first time interval from the end of the off state to the beginning of a complete conduction state, and a second time interval when the main switching transistor is completely on.

During the first time interval, the start-up current from the control terminal to the second power terminal can be substantially constant. For example, the start-up current from the control terminal to the second power terminal can be controlled to be substantially constant by, during the first time interval, controlling a first control transistor (e.g., Q2 in FIG. 3) connected between the second power terminal and ground to operate in a saturation mode, where the saturation current can be is consistent with (e.g., the same as) the start-up current. During the second time interval, the first control transistor and a second control transistor (e.g., Q3 in FIG. 3) connected between the second power terminal and ground to operate in a switching mode.

In another example, the start-up current from the control terminal to the second power terminal can be controlled to be substantially constant by, during the first time interval, controlling a control transistor (e.g., Q2 in FIG. 5) coupled between the second power terminal and ground to operate in a constant current mode. In this case, a first driving signal (e.g., Vdrive) can be provided to the control terminal of the control transistor by a current feedback circuit, in order to control the operation current of the control transistor to be consistent with (e.g., the same as) the start-up current. During the second time interval, a second driving signal (e.g., Vg) can be provided to the control terminal of the control transistor in accordance with a PWM control signal, in order to control the control transistor to operate in a switching mode.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A source driver circuit configured for a power converter comprising a main switching transistor having a control terminal and first and second power terminals, the source driver circuit comprising:
   a) a control transistor having a control terminal and first and second power terminals, wherein said control transistor is coupled between said second power terminal of said main switching transistor and ground;
   b) a power supply capacitor coupled between said control terminal of said main switching transistor and ground, wherein said power supply capacitor is configured to receive a bias voltage that is substantially constant;
   c) a regulation resistor coupled between said bias voltage and said control terminal of said main switching transistor;
   d) a freewheeling diode having a cathode coupled to said control terminal of said main switching transistor, and an anode coupled to said second power terminal of said main switching transistor;
   e) said control transistor being controllable to be periodically turned on and off to control said main switching transistor to correspondingly follow on and off states of said control transistor, wherein when said main switching transistor is on, a current of a main current path flows from said first power terminal of said main switching transistor to said second power terminal of said main switching transistor, and flows from said first power terminal of said control transistor to said second power terminal of said control transistor; and
   f) said main switching transistor having an on time interval comprising a first time interval from an end of an off state to a beginning of a fully on state, and a second time interval when said main switching transistor is fully on, wherein said control transistor is configured to provide a substantially constant start-up current during said first time interval.

2. The source driver circuit of claim 1, wherein:
   a) said control transistor comprises first and second control transistors coupled in parallel;

b) said first control transistor is conducted in a constant current mode, and said second control transistor is turned off, during said first time interval; and c) said first and second control transistors are conducted in a switching mode during said second time interval.

3. The source driver circuit of claim 2, wherein a control terminal of said first control transistor is configured to receive a first pulse-width modulation (PWM) control signal, and a control terminal of said second control transistor is configured to receive a second PWM control signal.

4. The source driver circuit of claim 3, wherein:
a) a switching period of said first PWM control signal is equal to a switching period of said second PWM control signal;
b) a duty cycle of said first PWM control signal is greater than a duty cycle of said second PWM control signal;
c) a conduction of said second control transistor is controlled to be later than a conduction of said first control transistor; and
d) said first and second control transistors are simultaneously turned off.

5. The source driver circuit of claim 2, wherein an on-resistance of said first control transistor is greater than an on-resistance of said second control transistor.

6. The source driver circuit of claim 1, further comprising:
a) a first driver unit configured to provide a first driving signal to said control terminal of said control transistor such that said control transistor operates in a constant current mode;
b) a second driver unit configured to provide a second driving signal to said control terminal of said control transistor such that said control transistor operates in a switching mode; and
c) an enable circuit configured to enable said first driver unit during said first time interval, and to enable said second driver unit during said second time interval.

7. The source driver circuit of claim 6, further comprising:
a) an operational amplifier having a non-inverting input configured to receive a reference current signal, an inverting input configured to receive a current feedback signal, and output configured to provide a current error signal to said first driving unit; and
b) said first driver unit being controllable by a current feedback circuit comprising said operational amplifier, wherein said first driver unit is configured to control said control transistor to generate a substantially constant start-up current.

8. The source driver circuit of claim 6, wherein said second driver unit is configured to generate a second driving signal in accordance with a PWM control signal.

9. The source driver circuit of claim 6, wherein said enable circuit comprises:
a) a first rising edge trigger circuit configured to receive a PWM control signal;
b) a second rising edge trigger circuit configured to receive a signal that represents an end of a start-up time of said main switching transistor; and
c) an RS flip-flop having a set terminal coupled to an output of said first rising edge trigger circuit, a reset terminal coupled to an output of said second rising edge trigger circuit, and being configured to provide a first enable signal to said first driver unit, and a second enable signal to said second driver unit.

10. The source driver circuit of claim 9, wherein said signal that represents said end of said start-up time of said main switching transistor is obtained by detecting a drain voltage of said main switching transistor.

11. The source driver circuit of claim 1, wherein each of said main switching transistor and said control transistor are selected from: a field effect transistor and a bipolar transistor.

12. A method of controlling a source driver circuit configured for a power converter comprising a main switching transistor having a control terminal and first and second power terminals, the method comprising:
a) coupling said control terminal of said main switching transistor to a bias voltage that is substantially constant;
b) changing a voltage of said second power terminal of said main switching transistor by controlling a voltage between said control terminal and said second power terminal of said main switching transistor to be higher or lower than a conduction threshold voltage of said main switching transistor to correspondingly turn on or off said main switching transistor;
c) wherein when said main switching transistor is on, a current of a main current path flows from said first power terminal of said main switching transistor to said second power terminal of said main switching transistor;
d) wherein an on time interval of said main switching transistor comprises a first time interval from an end of an off state to a beginning of a fully on state, and a second time interval when said main switching transistor is fully on; and
e) controlling a current flowing from said control terminal and said second power terminal of said main switching transistor to be a substantially constant start-up current during said first time interval by controlling a first control transistor coupled between said second power terminal and ground to conduct in a constant current mode during said first time interval, wherein a saturation current of said first control transistor is consistent with said start-up current, and controlling said first control transistor and a second control transistor coupled in parallel therewith to conduct in a switching mode during said second time interval.

13. A method of controlling a source driver circuit configured for a power converter comprising a main switching transistor having a control terminal and first and second power terminals, the method comprising:
a) coupling said control terminal of said main switching transistor to a bias voltage that is substantially constant;
b) changing a voltage of said second power terminal of said main switching transistor by controlling a voltage between said control terminal and said second power terminal of said main switching transistor to be higher or lower than a conduction threshold voltage of said main switching transistor to correspondingly turn on or off said main switching transistor;
c) wherein when said main switching transistor is on, a current of a main current path flows from said first power terminal of said main switching transistor to said second power terminal of said main switching transistor;
d) wherein an on time interval of said main switching transistor comprises a first time interval from an end of an off state to a beginning of a fully on state, and a second time interval when said main switching transistor is fully on;
e) controlling a current flowing from said control terminal and said second power terminal of said main switching transistor to be a substantially constant start-up current during said first time interval;

f) controlling a control transistor coupled between said second power terminal and ground to conduct in a constant current mode during said first time interval; and g) controlling, by a first driving signal from a current feedback circuit, said control transistor such that an operation current of said control transistor is the same as said start-up current.

14. The method of claim 13, further comprising providing a second driving signal to said control terminal of said control transistor in accordance with a PWM control signal for controlling said control transistor to operate in a switching mode during said second time interval.

\* \* \* \* \*